United States Patent [19]
Weiler et al.
[11] 3,740,817
[45] June 26, 1973

[54] COMPONENT INSERTION SYSTEM FOR CIRCUIT BOARDS

[75] Inventors: Gerhard H. Weiler, Des Plaines; Patrick M. Donavan, Schaumburg, both of Ill.

[73] Assignee: Weiler Engineering Inc., Elk Grove Village, Ill.

[22] Filed: Apr. 20, 1971

[21] Appl. No.: 135,550

[52] U.S. Cl. .................................. 29/203 B, 29/626
[51] Int. Cl. .......................................... H05k 13/04
[58] Field of Search .................... 29/203 B, 203 DT, 29/203 P, 626, 203 D

[56] References Cited

UNITED STATES PATENTS 2,970,370 2/1961 Weaver et al. .................... 29/203 B

*Primary Examiner*—Thomas H. Eager
*Attorney*—Dominik, Knechtel & Godula

[57] ABSTRACT

A component insertion system which is a completely computerized, automatic system that can be programmed to automatically assemble a pre-determined number of printed circuit boards.

The system is generally an inline system in that the printed circuit boards are transported from one station to another by means of an inline conveyor, however, its component insertion heads and their associated clincher assemblies are movably mounted, rather than being fixedly positioned as in the past. In the present system, the component insertion heads and the clincher assemblies each are mounted on X-Y tables so as to be movable with respect to the printed circuit boards. In addition, the component insertion heads and their associated clincher assemblies are rotatably mounted and controlled so that they may be angularly oriented with respect to the printed circuit boards. With this arrangement, a component can be affixed to a printed circuit board in virtually any pre-determined location.

24 Claims, 13 Drawing Figures

INVENTORS
Gerhard H. Weiler
Patrick M. Donavan

BY Dominik, Knechtel & Godula
ATTYS.

INVENTORS
Gerhard H. Weiler
Patrick M. Donavan
BY Dominik, Knechtel & Godula
ATTYS.

INVENTORS
Gerhard H. Weiler
Patrick M. Donavan
BY Dominik, Knechtel & Godula
ATTYS.

PATENTED JUN 26 1973

3,740,817

SHEET 4 OF 6

INVENTORS
Gerhard H. Weiler
Patrick M. Donavan

BY Dominik, Knechtel & Godula
ATTYS.

INVENTORS
Gerhard H. Weiler
Patrick M. Donavan
BY Dominik, Knechtel & Godula
ATTYS.

INVENTORS
Gerhard H. Weiler
Patrick M. Donavan
BY
Dominik, Knechtel & Godula
ATTYS.

COMPONENT INSERTION SYSTEM FOR CIRCUIT BOARDS

This invention relates, generally, to an improved component insertion system and method for assembling components such as resistors, capacitors, bridge wires and the like on apertured printed circuit boards.

There are presently two different systems of the above-mentioned type which are most commonly used for assembling such components on apertured printed circuit boards. In both of these systems, the components such as resistors and capacitors usually are secured in a pair of spaced apart tapes, and these tapes are wound on a spool in a fashion such that a substantially continuous supply of components can be fed to the component insertion heads. To fasten the components to the printed circuit board, the wire extensions or leads of the components are first cut to a given length, and then bent over and inserted into the apertures in the boards. Thereafter, the portions of the wire extensions or leads extending beneath the board are bent over to secure the component to the board.

In one of these systems, a number of component insertion heads are employed, and in a typical installation, the printed circuit boards are fed one at a time from a magazine onto an inline conveyor assembly which progressively advances the individual boards from one component insertion head, or station, to another. The components then are assembled or affixed to the boards in a sequential fashion, in predetermined fixed locations, by these component insertion heads.

In most, if not all, of the systems of this type, generally referred to as inline systems, the component insertion heads are of the fixed head type. That is, the heads are secured in a fixed position with respect to the printed circuit boards, and are operable to only affix a component to the boards in a pre-determined position, usually one which is either parallel or perpendicular to the longitudinal axis of the board, although in some cases the components are positioned in a pre-determined angular position. For this reason, the component insertion heads are limited to handling only one component of a pre-determined value.

Accordingly, in these inline systems, a different component insertion head has to be provided for each different component which is to be affixed to the printed circuit boards. If, for example, 40 different components are to be affixed to a board, these systems require 40 stations, or component insertion heads. These systems, therefore, not only require substantial space for installation, but are both extremely costly and complex to install.

The other systems most commonly employed are generally referred to as board indexing systems, and they include an X-Y table upon which the printed circuit boards are placed, and a fixed component insertion head. The X-Y table is indexed, in some fashion, to position the printed circuit board with respect to the fixed component insertion head, to affix a component to the printed circuit board in a pre-established position.

In these board indexing systems, a number of different components can be affixed to a printed circuit board, at a high rate of speed and in various different positions. They therefore do offer a number of advantages over the inline systems, the principal one being that one component insertion head can be used to affix a number of different components to a printed circuit board. Accordingly, in these board indexing systems, the number of component insertion heads, or stations, normally can be substantially reduced.

The main disadvantage of these board indexing systems, however, is there very limited capacity. Normally, only one or two fixed component insertion heads can be used in conjunction with one X-Y table, the latter being adapted to support one printed circuit board in an operative relationship with each of the respective component insertion heads. Accordingly, an operator usually has to be stationed at the machine, or system, to insert and remove the printed circuit boards. The overall capacity of the installation can, of course, be increased by adding additional machines, or systems, however, the number of operators also must be correspondingly increased. This fact as well as the manual labor involved in merely inserting and removing the printed circuit boards seriously limits the productivity of such systems.

The above-described disadvantage, as well as a number of other disadvantages of both of the inline and board indexing systems, are overcome with the component insertion system of the present invention. This present system is a completely computerized, automatic system which can be programmed to automatically assemble a pre-determined number of printed circuit boards much faster and with far fewer incomplete or rejected boards than most comparable systems.

The system itself is generally an inline system in that the printed circuit boards are transported from one station to another by means of an inline conveyor. The system therefore has all of the advantages provided by such inline systems, however, the disadvantages of these systems are overcome by movably mounting the component insertion heads and their associated clincher assemblies, rather than fixedly positioning them as in the past. In the present system, the component insertion heads and the clincher assemblies each are mounted on X-Y tables so as to be movable with respect to the printed circuit boards, much like the latter are movably positioned with respect to the component insertion heads in the described board indexing systems. In addition, the component insertion heads and their associated clincher assemblies are rotatably mounted and controlled so that they may be angularly oriented with respect to the printed circuit boards. With this arrangement, a component can be affixed to a printed circuit board in virtually any pre-determined location. Accordingly, it can be seen that the present system likewise has the advantages of the board indexing systems, but the limitations and the manual labor contributable to the latter are eliminated.

The component insertion heads used in both types of systems also are objectionable for various reasons. Most of them are of a complex construction so that they are costly to fabricate. Also, many have a tendency to jam, and normally have to be dis-assembled to place them back in working order. In this case also, the complex construction is a detriment in that it requires considerable time and skill to dis-assemble and then again assemble the heads.

It is an object of the present invention to provide an improved component insertion system and method for assembling components on apertured printed circuit boards.

Another object is to provide an improved component insertion head.

A still further object is to provide an improved component insertion system wherein components can be affixed to apertured printed circuit boards in a pre-established orientation with respect to the boards, while the latter are being conveyed in an inline manner.

Other objects of the invention will in part be obvious and will in part appear hereinafter.

The above objectives are accomplished by providing a component insertion system of the above generally described construction, wherein the method of inserting and affixing a component to a printed circuit board includes, generally, the steps of conveying in an inline manner a printed circuit board to a station defined by a component insertion head and a clincher assembly, operating the X-Y table to which the component insertion head and clincher assembly are secured to position them at a pre-determined X-Y coordinate position with respect to the board, rotating the head and the clincher assembly to position them at a pre-determined angular orientation with respect to the board, and then operating the head and clincher assembly to insert and affix a component to the board.

The invention accordingly comprises the several steps and the relation of one or more of such steps with respect to each of the others and the apparatus embodying features of construction, combination of elements and arrangements of parts which are adapted to effect such steps, all as exemplified in the following detailed disclosure, and the scope of the invention will be indicated in the claims.

For a fuller understanding of the nature and objects of the invention, reference should be had to the following detailed description taken in connection with the accompanying drawings in which.

Similar reference characters refer to similar parts throughout the several views of the drawings.

Figure 1:
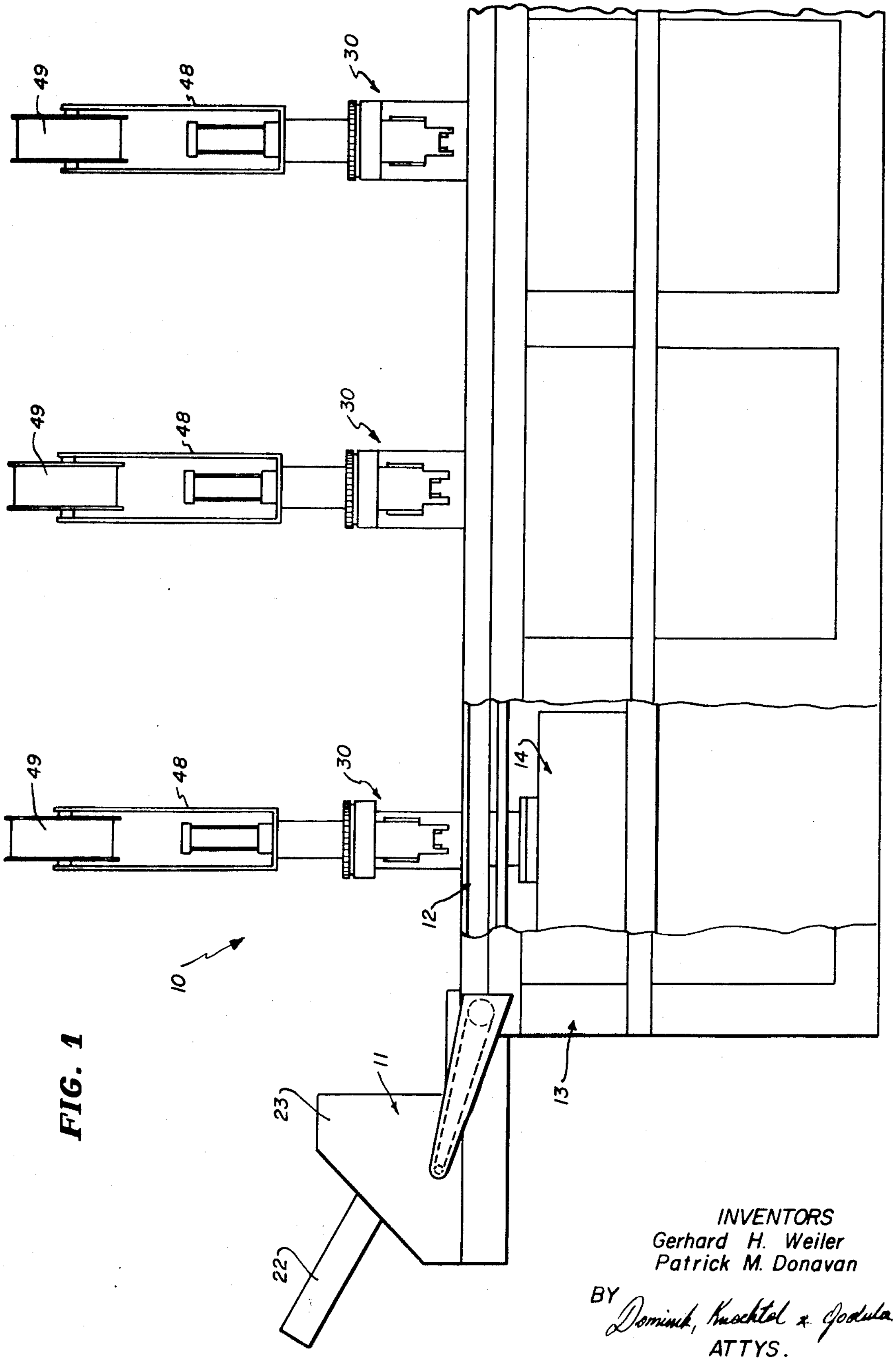
FIG. 1 is a side plan view of a component insertion system exemplary of the present invention.

Referring now to the drawings, in FIG. 1 a portion of a component insertion system 10 exemplary of the present invention is illustrated, and it can be seen to include a magazine feeder 11 adapted to store and to feed individual printed circuit boards (not shown) onto an inline conveyor 12. The operation of the magazine feeder 11 in feeding the boards onto the conveyor 12 is coordinated with the latter so as to provide a continuous flow of boards to the different stations of the system, three of which are shown for purposes of illustration, however, any number of such stations can be provided. Each of these stations generally is defined by a component insertion head 30, a clincher assembly 36 and an X-Y table 14, upon which the heads 30 and the clincher assemblies 36 are mounted. In the description below the conveyor 12 is mounted atop a box-like frame 13 which is of a construction such as to form an enclosure for the electrical and hydraulic circuitry (not shown) coupled to and used to control the conveyor 12, the component insertion heads 30, the clincher assemblies 36, and the X-Y tables 14, as well as some other related equipment such as interlocking switches, hydraulic valving and the like.

Figure 2:
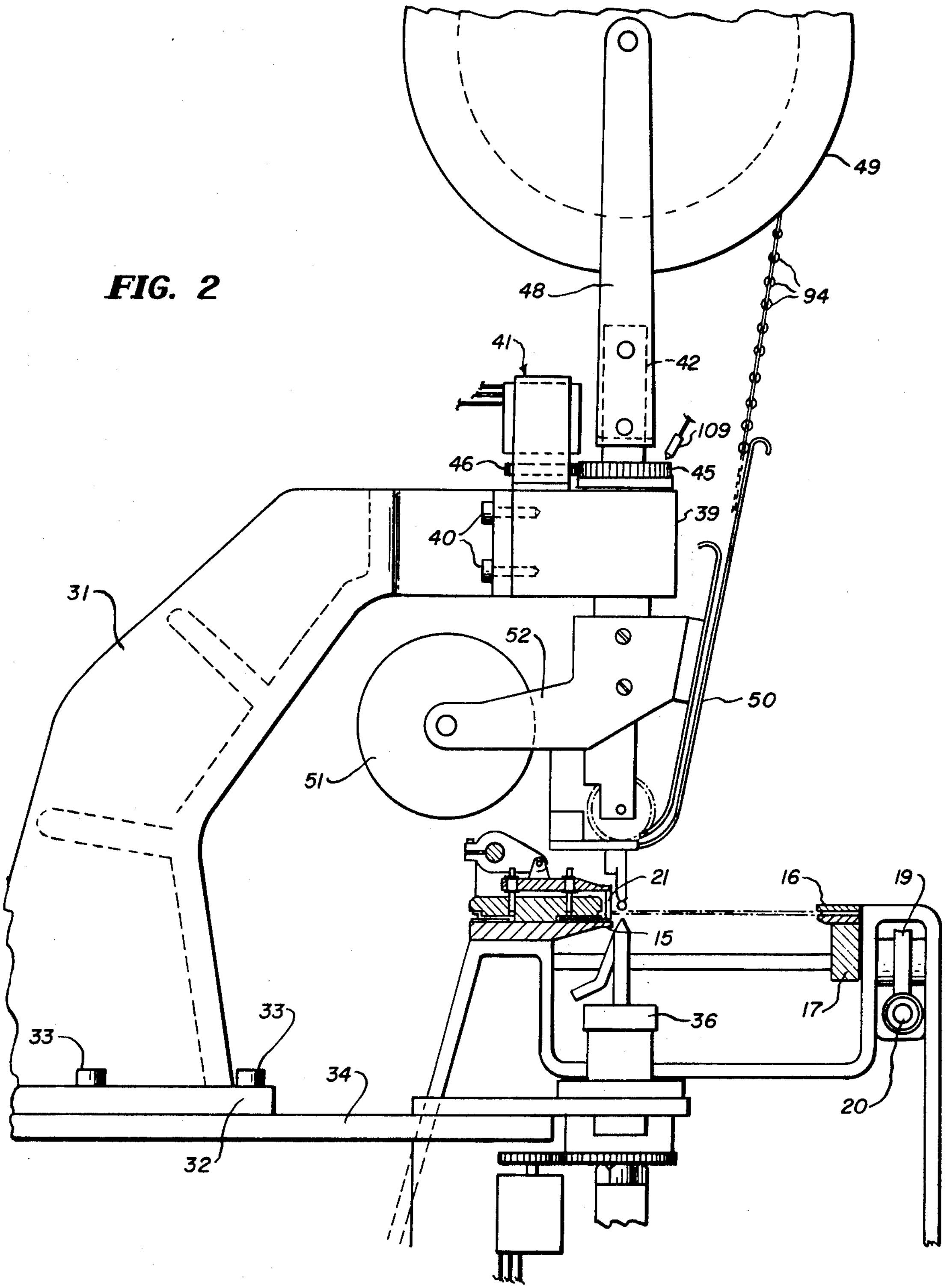
FIG. 2 is a side plan view generally illustrating a component insertion head forming one station of the system of FIG. 1.

The printed circuit boards are positionally advanced or indexed from station to station on the conveyor 12, the latter being in the form of an endless chain having means thereon for engaging and advancing the printed circuit boards. The printed circuit boards, as they are advanced by the conveyor 12, are supported on a pair of spaced-apart support rails 15 and 16, as can be best seen in FIG. 2. The support rail 15 is fixed stationary, while the support rail 16 is supported by means of a number of spaced-apart bearing blocks 17, each of which is coupled to a ball screw 18. The latter each are affixed to worm gears 19 which are all driven in synchronism by a worm gear shaft 20. When the latter is rotatably driven, the support rail 16 can be adjustably positioned to accommodate different size in width boards.

The printed circuit boards are indexed from station to station, with an accuracy of approximately 0.004 inches, and are located thereat, with an accuracy within the tolerance limits of the printed circuit boards. These tolerance limits usually are approximately 0.003 inches. At each station, the printed circuit boards are located by means of locating pins 21 which extend through locating apertures in the printed circuit boards.

Before the system will function to index the printed circuit boards, a number of conditions must exist. Among these conditions is the requirement that all of the component insertion heads 30 be in an up position, all of the clinchers 36 be in a down position, and all of the locating pins 21 be retracted from the printed circuit boards. Then, if the conveyor 12 is at its proper position and the magazine feeder 11 has fed another printed circuit board onto the conveyor, the system will operate to index and position each of the printed circuit boards at the next station.

The magazine feeder 11 is automatic in operation and includes as its principal components a magazine or hopper 22 for the storage of approximately 300 printed circuit boards and a board feeder 23 which includes a board straightener. The board feeder 23 operates to release the individual printed circuit boards from the magazine 22 and to feed them through the board straightener, onto the conveyor 12.

In this case also, a number of pre-established conditions must exist before the magazine feeder 11 will function. For example, there must be a number of boards in the magazine 22 and each, before being fed therefrom, must be properly oriented. The conveyor 12 must also be ready to receive a board. If a board is warped, it will be accepted by the system if warpage is within pre-established reasonable tolerance limits. In case of a mis-feed, the magazine feeder 11 will cycle a preset number of times, three times in an operative system, and if it still misfeeds, the entire system will be shut down and an alarm indicated of the mis-feed. If the pre-programmed number of printed circuit boards has been fed onto the conveyor 12, the magazine feeder 11 automatically shuts off, but the entire system continues to function until all of the boards on the conveyor 12 have been indexed through each of the stations, to complete their assembly. As indicated above, each station includes and is defined by a component insertion head 30 and a clincher assembly 36, both of which are affixed to an X-Y table 14.

The X-Y tables 14 can be any one of the many off-the-shelf tables presently available, such as, for example, the X-Y tables manufactured by the Superior Electric Company or the Universal Instruments Corporation, so long as they are generally capable of operating in the manner described below. These tables may have to be slightly modified to permit the component insertion heads 30 and the clincher assemblies to be mounted on them, for operation in the hereinafter described fashion.

Figure 7:
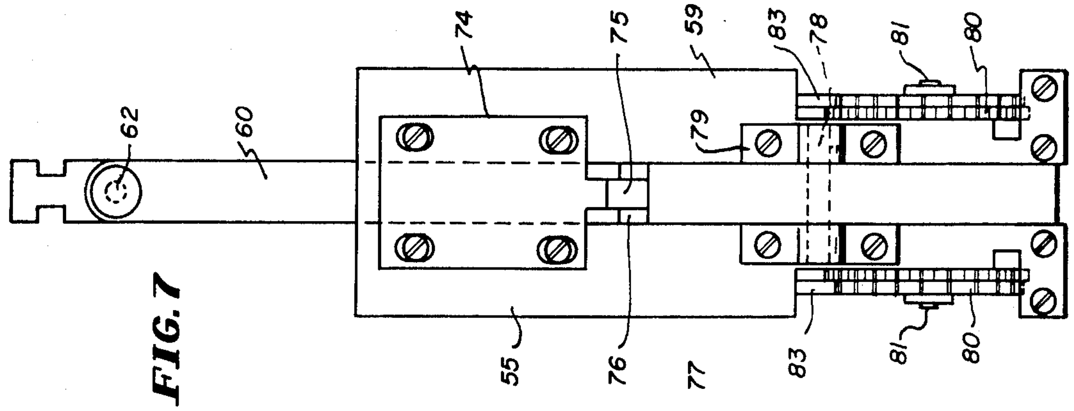
FIGS. 5–7 are front, side and rear plan views, respectively of a component insertion head.
Figure 6:
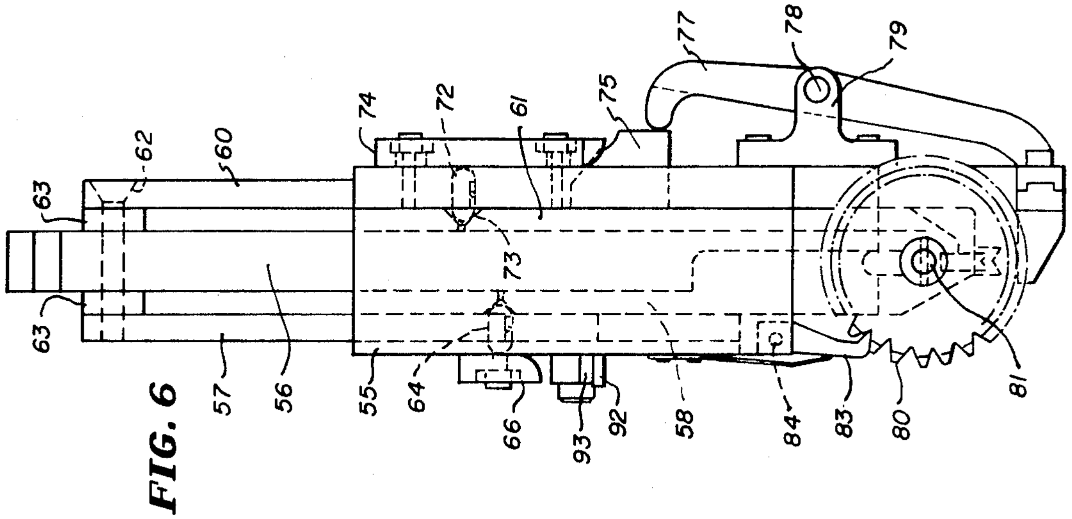
Figure 5:
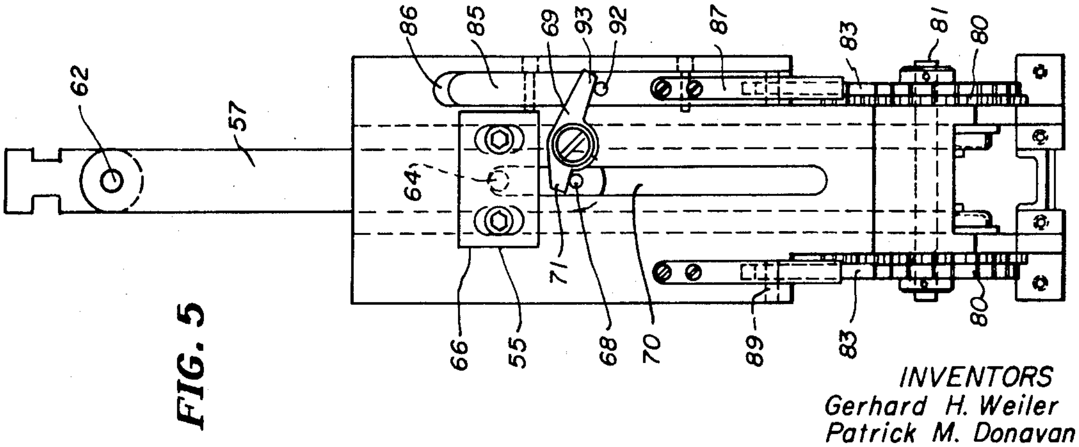
Figures 8, 9, 10, 11:
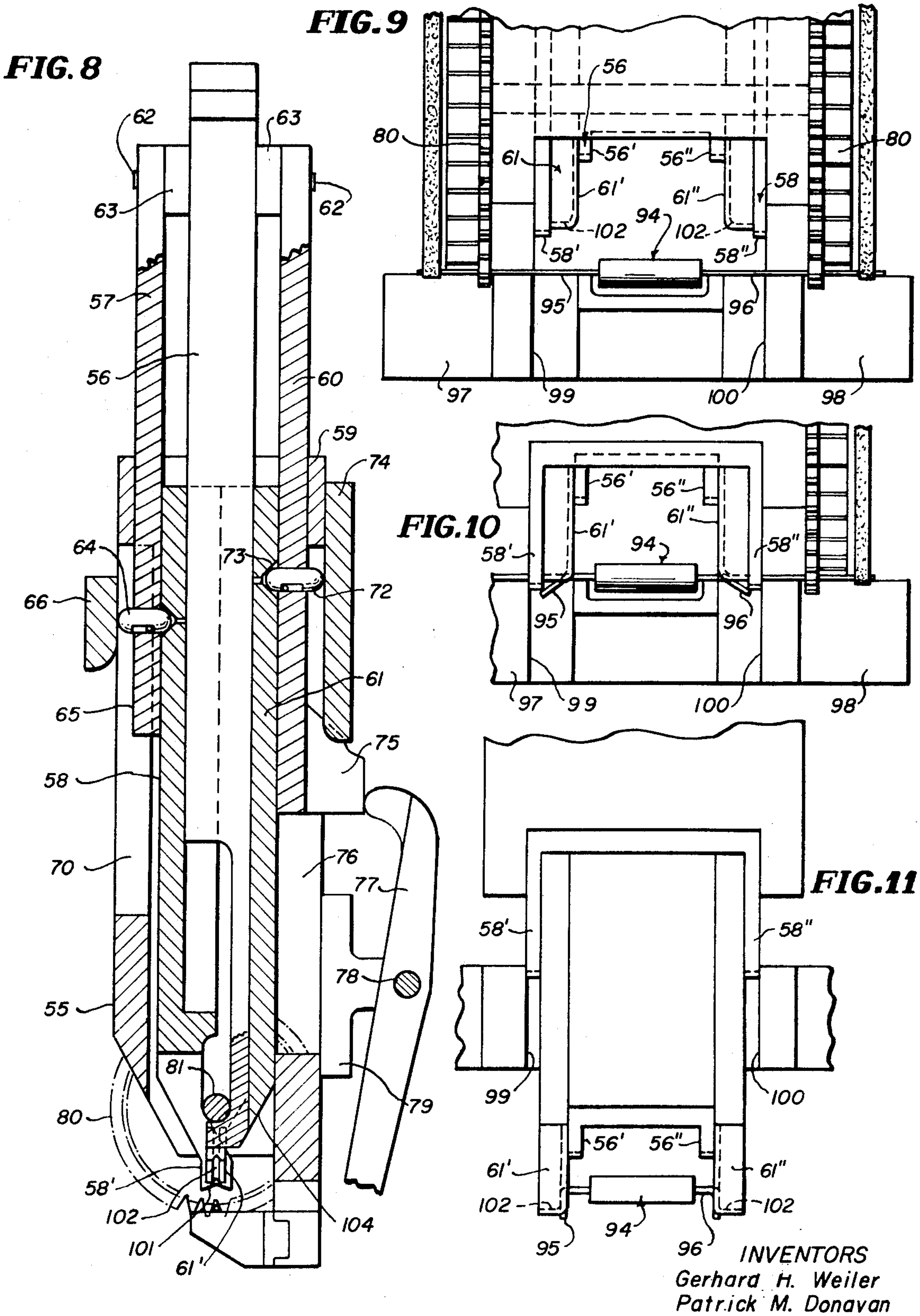
FIG. 8 is a sectional view taken transversely through a component insertion head, along the vertical axis thereof.
FIGS. 9–11 are partial plan views generally illustrating the manner in which a component is cut, formed and inserted into a printed circuit board.

The component insertion heads 30 all are generally of the same construction and, as indicated above, are of an improved, simplified construction rendering them less expensive to manufacture and assemble, more trouble-free in operation, and in the event of jamming, more simple to again place back in operation. These component insertion heads, as can be best seen in FIGS. 5–8 wherein one of them is shown in detail, include a generally rectangular-shaped body portion 55 which is formed to slidably receive and retain therein a slide insert 56 (FIGS. 6 and 8), a detent carrier slide 57 (FIGS. 5, 6 and 8) and a lead cutter slide 58 (FIGS. 6 and 8). A cover plate 59 affixed to the body portion 55 assists in retaining the slide insert 56, the detent carrier 57 and the lead cutter slide 58 therein, and further is formed to slidably receive a cam and detent carrier slide 60 (FIGS. 6–8). A lead form slide 61 is slidably disposed and retained between this cam and detent carrier slide 60 and the slide insert 56, as can be best seen in FIG. 8. The upper ends of the detent carrier slide 57 and the cam and detent carrier slide 60 are affixed to the slide insert 56, near the latter's upper end, by means of pin means 62 extended through apertures formed in each of them. Spacers 63 are disposed between the slide insert 56 and each of the slides 57 and 60. Being physically affixed together, the slide insert 56 and the slides 57 and 60 are simultaneously actuated, when the slide insert 56 is actuated by the hydraulic cylinder 44, as described more fully below.

The detent carrier slide 57 has a detent receiving aperture extending through it, within which is disposed a detent 64. This detent 64 is operative to seat within a detent seat 65 formed in the lead cutter slide 58, to operate the latter to slide it vertically downwardly, as seen in FIG. 8, when the slide insert 56 is correspondingly operated, until the detent 64 clears the detent cam bracket 66 affixed to the body portion 55. At this point, the detent 64 which is spring loaded is unseated, and movement of the lead cutter slide 58 is terminated.

The detent carrier slide 57 also has an index slide actuating pin 68 affixed adjacent its lower end which functions to operate an index lever 69 secured to the body portion 55. As can be best seen in FIG. 5, this actuating pin 68 extends through an elongated slot 70 in the body portion, and one arm 71 of the index lever 69 overlies this slot 70 and is engaged by the actuating pin 68, as the detent carrier slide 57 is vertically moved up and down. This slot 70 also provides clearance for the detent 64 to disengage from the detent seat 65.

The cam and detent carrier slide 60 likewise carries with it a detent 72 which is formed to seat within a detent seat 73 formed in the lead form slide 61 to move the latter vertically upwardly and downwardly. This detent 72 is seated by means of a detent cam bracket 74 secured to the cover plate 59. This cam and detent carrier slide 60 also has a cam 75 secured to its lower end, and the cover plate 59 is provided with an elongated slot 76 to accommodate this cam 75 to permit it to engage and actuate a lead cutoff lever arm 77 pivotally secured by means of a pivot pin 78 within a bracket 79 secured to the cover plate 59.

A pair of index wheels 80 are rotatably secured by means of an index wheel axle 81 at the lower end of the body portion 55, in a position disposed to convey the components to be affixed to the printed circuit boards beneath the component insertion head so that these components can be cut, formed and inserted. An index pawl 83 is pivotally affixed by means of a pivot pin 84 to the lower end of an index pawl actuator slide 85 fixedly and slidably retained within an index pawl actuator slide cavity 86 formed in the body portion 55, as can be best seen in FIG. 5. The index pawl 83 is spring biased in engagement with the index wheel 80 by means of a leaf spring 87 secured to the index pawl actuator 85. A similar index pawl 88 is pivotally affixed by means of a pivot pin 89 to the body portion 55 so as to engage the other one of the index wheels 80, and is biased by means of a leaf spring 90. The index pawl 88 is merely a follower while the index pawl 83 is operated by the index pawl actuator slide 85 to advance the index wheels 80 to feed additional components.

The index pawl actuator slide 85 is actuated by means of a pin 92 which is affixed to it and is disposed to be engaged by the other arm 93 of the index lever 69. When the detent carrier slide 57 is moved vertically upwardly, the index slide actuating pin 68 engages the arm 71 of the index lever 69 causing the latter to pivot clockwise. This action engages its arm 93 with the pin 92 affixed to the index pawl actuator slide 85, thereby causing the latter to move vertically downwardly, to engage the index pawl 83 with the index wheel 80 to rotatably advance the latter. The index pawl actuator slide 85 normally is biased vertically upwardly by means not shown, so that upon release it returns to its normally biased position to ready itself for the next operation.

The lower ends of the slide insert 56, the lead cutter slide 58, and the lead form slide 61 all are formed generally U-shaped, in a fashion such as to provide spaced-apart lead cutters 58' and 58'', lead formers 61' and 61'' and insert heads 56' and 56'', the lead former 61' and the insert head 56' are slidably nested together, as are the lead cutter 58'', the lead former 61'' and the insert head 56'', and each nested set functions in conjunction with the end of the lead form lever arm 77 to cut, form and insert the wire leads or extensions 95 and 96 of a component 94, as described more fully below.

The component 94 is fed and positionally held by the index wheels 80 resting across the top surfaces of top spaced-apart abutments 97 and 98, beneath the ends of the slide insert 56, the lead cutter slide 58 and the lead form slide 61, as can be best seen in FIGS. 8 and 9. The facing edges of these abutments 97 and 98 function as cutting edges 99 and 100, to sever and cut to length the wire leads 95 and 96 of the component 94.

These component insertion heads 30 are each supported in a vertically disposed position by means of a generally L-shaped support arm 31. The mounting base 32 of the support arm 31 is secured by means of mounting bolts 33 atop an X-Y table 14, with the component insertion head 30 positioned over the conveyor 12. The associated clincher assembly 36 which can be of a standard construction is affixed to the X-Y table 14, in a position below the printed circuit boards carried by the conveyor 12, to operate in conjunction with the component insertion head 30 to secure the components to the printed circuit boards, in the manner described more fully below.

Figures 3, 4:
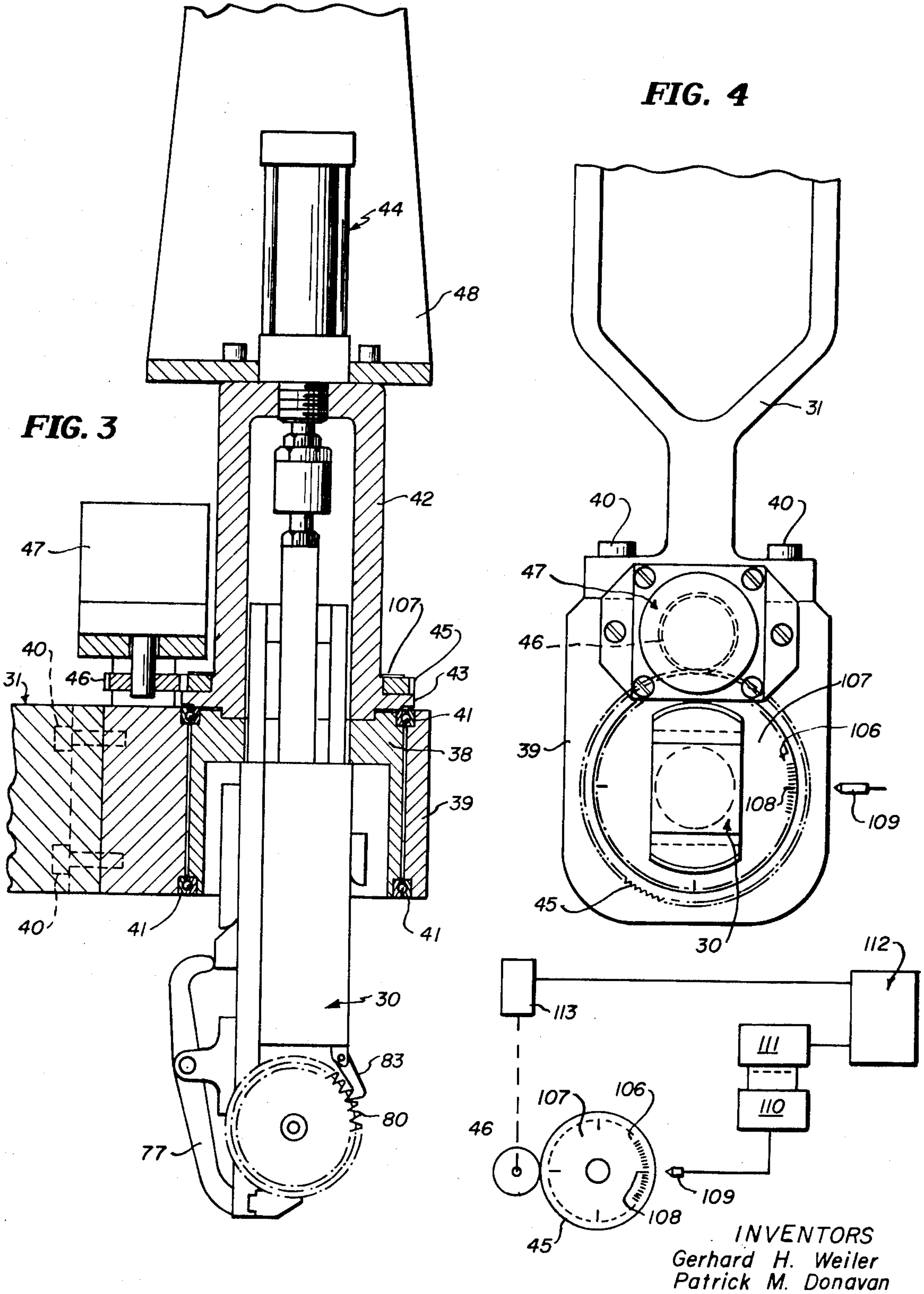
FIG. 3 is a partial sectional view of a component insertion head, taken substantially through the transverse vertical axis thereof.
FIG. 4 is a top plan view of a component insertion head.

As can be best seen in FIGS. 1, 3 and 4, the component insertion head 30 further is securely supported within a rotary head 38 which is rotatably retained within a housing 39 secured by means of mounting bolts 40 to the upper end of the support arm 31. A bearing 41 is secured between the rotary head 38 and the housing 39, at the top and bottom portions thereof, for providing substantially friction-free rotary movement of the rotary head 38.

A generally U-shaped mounting bracket 42 having an enlarged annular flange 43 is secured atop the rotary head 38. This bracket 42 supports a hydraulic cylinder 44 which functions to operate the component insertion head 30, and a driven gear 45 which is affixed to and supported by the flange 43. This driven gear 45 is matingly engaged with and is driven by a pinion gear 46 which is, in turn, rotatably driven by a hydraulic rotary actuator 47.

A pair of spool support brackets 48 (FIGS. 2 and 3) are secured to the mounting bracket 42, and are adapted to support therebetween a spool 49 having wound thereon a substantially continuous supply of the components to be inserted or affixed to the printed circuit boards. These components can be carried by means of a pair of spaced-apart tapes which have the leads or extensions of the components secured therebetween, in the well-known manner. These components are fed from the spool 49 through guide means 50 which is positioned and arranged to deliver the components to the component insertion head 30 in a fashion such that the latter are operable to insert them into the printed circuit boards.

Figures 12, 13:
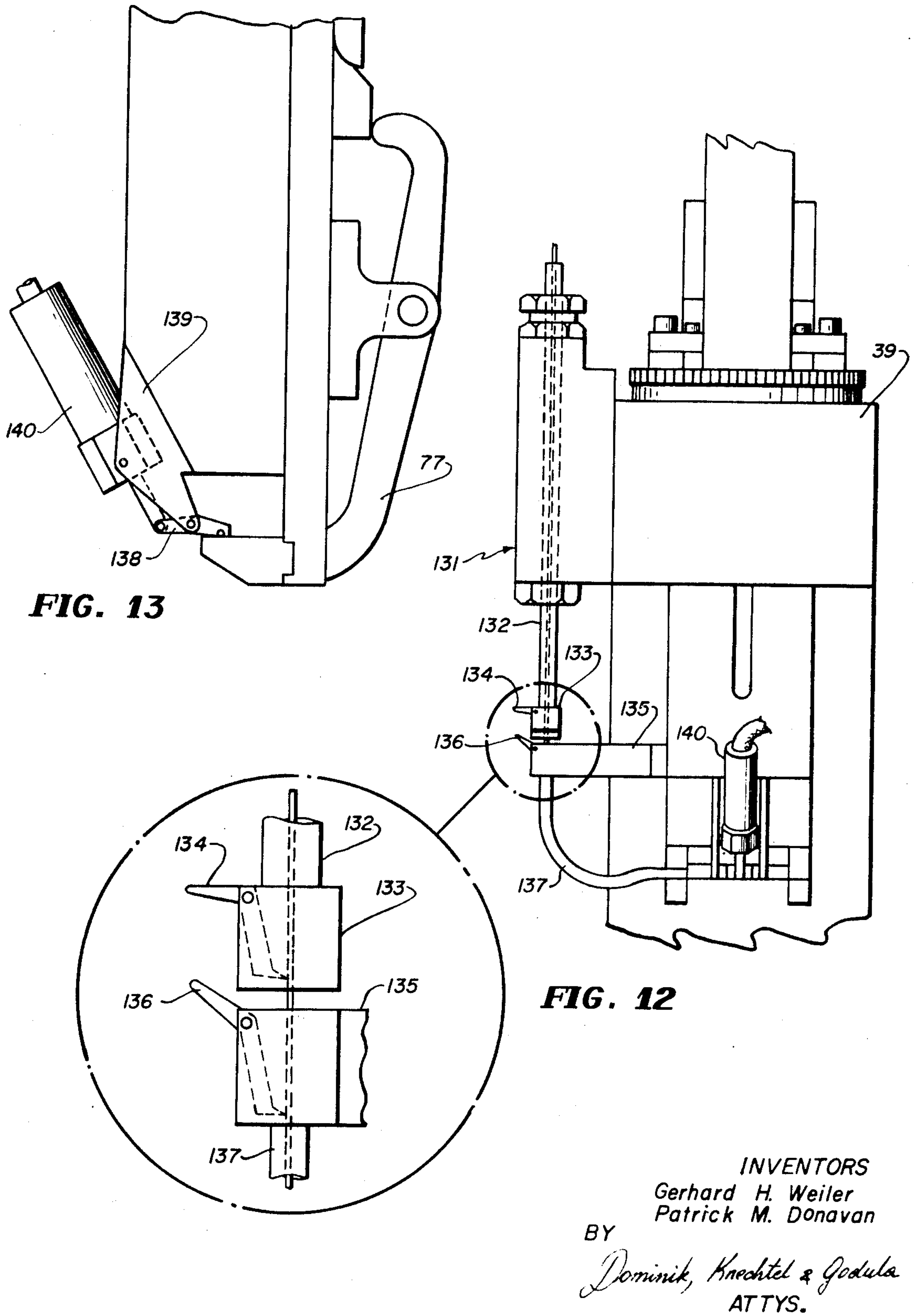
FIG. 12 is a front plan view of a jumper wire insertion head.
FIG. 13 is a partial side plan view of the jumper wire insertion head of FIG. 12.

In FIGS. 12 and 13, there is illustrated a jumper wire insertion head 130 for cutting, forming and affixing jumper wires to printed circuit boards. This jumper wire insertion head 130 is generally of the same construction and operates in substantially the same manner as the component insertion heads 30, the only major difference being in the elimination of the mechanism for feeding components thereto and the substitution of a wire feeding mechanism.

More specifically, the index wheels 80 and the associate mechanism for operating them to feed a component are eliminated on the jumper wire insertion head 130. In substitution therefore, a wire feed mechanism is provided for feeding a pre-determined length of jumper wire to the jumper wire insertion head, for a continuous length of wire. The jumper wires are cut to proper length, formed and affixed to the printed circuit board, all automatically. Since the jumper wires are cut to proper length, there is no waste material remaining.

This wire feed mechanism includes a wire feed hydraulic cylinder 131 having a piston 132. This cylinder 131 is mounted to the housing 39, and the wire is fed from a spool (not shown) supported by the jumper wire insertion head 130 in generally the same fashion as the component spools 49, into and through the cylinder 131 and its piston 132. A wire gripper 133 is secured to the lower end of the piston 132, and has a pawl 134 pivotally affixed to it in a fashion such as to grip and pull the wire downwardly as the piston 132 is moved downwardly from the cylinder 131. On the return stroke of the piston 132, the pawl 134 is disengaged from the wire so that the latter is advanced only in one direction.

A wire guide and stop 135 is mounted immediately below the end of the piston 132, and it likewise includes a pawl 136 which is operable to permit the wire to move downwardly but, on the return stroke of the piston 132, it grips the wire and prevents the wire from being retracted. A tubular guide 137 is affixed to the wire guide and stop 135 and is formed to feed the wire through it to a position beneath the cutting, forming and inserting members of the jumper wire insertion head 130. As can be best seen in FIG. 12, the wire is fed atop the lead forming lever arm 77 and is positioned thereon in substantially the same manner as a component in the case of the component insertion heads 30. Once in this position, the wire is held fixed by means of a wire guide 138 which is pivotally affixed to a bracket 139 and is pivotally operated by the piston 141 of a hydraulic cylinder 140 to clamp the wire between it and the end of the lead forming lever arm 77.

In operation, the length of the jumper wire fed to the jumper wire insertion head 130 is controlled by the downward stroke of the piston 132 of the hydraulic cylinder 131. The stroke of this piston 132 is arranged such that only a predetermined length of wire corresponding to that desired for the jumper wire is fed into position beneath the jumper wire insertion head 130. Thereafter, the latter is operated in the same fashion as the component insertion heads 30 to cut, form and affix the jumper wire to a printed circuit board. A clincher assembly like those used in conjunction with the component insertion heads is, of course, likewise used in conjunction with the jumper wire insertion head 130.

For the purpose of describing the operation of the component insertion system, assume that the conveyor 12 has indexed a printed circuit board to one or more of the system's stations. As indicated above, the system is a pre-programmed, computerized, automatic operation, the components having previously been affixed within the tapes wound on the spools 49 in accordance with the order in which they are to be affixed to the printed circuit boards. The computer also has been programmed as to the location of each of these components on the printed circuit boards.

This information is fed to the magazine feeder 11, the conveyor 12 and to the control circuitry for the component insertion heads 30, the clincher assemblies 36 and the X-Y tables 34. In an operable system, the X-Y tables 34 are electronically controlled by means of a Model 128 Multiple Axis Numerical Control System manufactured by National Electro-Mechanical Systems, Inc., Binghamton, N.Y. With this control system, the component insertion heads 30 and the clincher assemblies 36 can be positioned in a pre-programmed X-Y coordinate position, with respect to the printed circuit boards, at a positioning speed of approximately 300 inches per minute, with an accuracy of approximately ± 0.0005 inches. Other comparable X-Y table controls likewise can be used.

The component insertion heads 30 and the clincher assemblies 36 also can be and are automatically rotatably operated in a fashion such that components can be inserted in any predetermined angular orientation with respect to the printed circuit board. Accordingly, subsequent to or simultaneously with the positioning of the X-Y table in accordance with the X-Y coordinate position of the component, the component insertion head 30 and the associated clincher assembly 36 is automatically rotatably operated to the pre-determined angular position of the component.

For this purpose, a graduated scale 106 is provided on a flat cover plate 107 or the like fixed securely to and rotatably with the component insertion head 30, as can be best seen in FIGS. 3 and 4. This graduated scale 106 extends arcuately about the cover plate 107, and may be radially graduated in, for example, degress over a 90° segment on each of the opposite sides of a reference index 108, thereby providing for 180° rotation of the component insertion head 30. Detecting means such as an optical scanner 109 is positioned to detect or read the graduated scale 106 as the component insertion head 30 rotates, and to provide an output pulse which is coupled to a logic circuit 110 which functions to count these output pulses. The output of the logic circuit 110 is coupled to a decoder unit 111 which is also supplied information from a computer 112 which functions in conjunction with or may consist of a part of the circuitry for controlling the X-Y tables 14.

The computer 112, in accordance with the pre-established program and in coordination with the operation of the X-Y table 14, provides an output signal to a control unit 113 which controls the activation of the hydraulic rotary actuator 47 to cause the latter to rotate the component insertion head 30 in either a clockwise or counter-clockwise direction. Simultaneously, the computer 112 signals the decoder unit 111 and establishes the desired angular rotation or positioning of the component insertion head 30. When the logic circuit 110 detects output pulses corresponding to the desired angular rotation, an output signal is coupled to the decoder unit 111. The latter, in turn, provides an output signal to the computer 112 which then triggers the control unit 113 to stop rotation of the component insertion head 30. After the component insertion head 30 is operated to affix the component to the printed circuit board, in a manner fully described below, it is caused to return to its original position in readiness for the next operation.

The clincher assembly 36 can be operated in a corresponding fashion, or alternately, it can be mechanically coupled to the component insertion head 30 so as to function as a slave. In either case, only the one detecting means need be provided.

Referring now to FIGS. 8–11, the operation of a component insertion head 30 in cutting, forming and inserting a component into a printed circuit board can be described. In FIG. 9, it can be seen that a component 94 has been positioned and is being held by the index wheels 80, with its wire leads 95 and 96 resting across the top surfaces of the abutments 97 and 98. The hydraulic cylinder 44 now is automatically actuated to urge the slide insert 56 vertically downwardly. As it moves, the detent carrier slide 57 and the cam and detent carrier slide 60 both are slidably moved with it. The detent 64 at this time is seated in the detent seat 65 in the lead cutter slide 58, and the latter thereby is caused to slidably move along with the detent carrier slide 57. As it moves downwardly, the lead cutters 58′ and 58″ on the end of the lead cutter slide 58 engages and severs the wire leads 95 and 96 of the component 94 to cut them to length. As can be best seen in FIG. 8, these lead cutters 58′ and 58″ have V-shaped cutting edges 101 formed on the terminal ends thereof. The V-shape of these cutting edges 101 assist in positioning the wire leads 95 and 96 to assure subsequent engagement of them by the lead formers 61′ and 61″.

The downward movement of the lead cutter slide 58 terminates when the detent 64 passes free of the detent cam bracket 66, thereby permitting the detent 64 to unseat from the detent seat 65. The lead cutters 58′ and 58″ are positioned generally as shown in FIG. 10 at this time.

The detent 72 is carried by the cam and detent carrier slide 60 likewise is seated within the detent seat 73 in the lead form slide 61, hence the latter also moves downwardly with the cam and detent carrier slide 60, as well as the slide insert 56, the detent carrier slide 57 and the lead cutter slide 58. Almost immediately upon being severed, the wire leads 95 and 96 are engaged by the lead formers 61′ and 61″ on the end of the lead form slide 61. At this time, these wire leads 95 and 96 are positionally held resting atop the lead form lever arm 77. It may be noted that the lead formers 61′ and 61″ are substantially wider in width than the lead cutters 58′ and 58″, and have wire receiving grooves 102 therein which extend along their lower edges and upwards in the facing surfaces thereof. The wire leads 95 and 96 are retained within these wire receiving grooves 102, and as the lead form slide 61 continues to move downwardly, these wire leads 95 and 96 are forcibly folded over the cooperating edges of the lead form lever arm 77, as can be seen in FIG. 10.

At about the time that the wire leads 95 and 96 are folded or bent at a 90° angle about the lead form lever arm 77, the opposite end of the latter rides free of the cam 75 on the cam and detent carrier slide 60. Simultaneously, a camming surface 104 on the lead form slide 61 engages and pivotally operates the lead form lever arm 77 to disengage its end from between the wire leads 95 and 96 and to pivotally move it to an out-of-the-way position, where it will not interfere with subsequent movement of the component 94. At this time, the component 94 is frictionally held between the lead formers 61′ and 61″, with the wire leads 95 and 96 frictionally seated within the wire receiving grooves 102, as can be best seen in FIG. 11.

The downward movement of the lead form slide 61 continues until the detent 72 rides free of the detent cam bracket 74, at which time the detent 72 is unseated from the detent seat 73. The arrangement here is such that the component 94 is carried and positioned just above the printed circuit board by the lead form slide 61, at the time its downward movement is terminated.

The wire leads 95 and 96 of the component 94 now are engaged by the lead inserts 56′ and 56″ of the slide insert 56, as its downward movement advances. The terminal ends of the lead inserts 56′ and 56″ are formed V-shaped like the terminal ends of the lead cutters 58′ and 58″ to permit the wire leads 95 and 96 to seat therein as they are pushed downward into and through the receiving apertures in the printed circuit board. It may be noted that the wire leads 95 and 96 are guided by the wire recieving grooves 102 in the lead formers 61′ and 61″, as the component 94 is being affixed to the printed circuit board, to assure proper alignment of the wire leads. The component 94 is held against the printed circuit board, until the clincher assembly 36 has operated to spread the ends of the wire leads 95 and 96 projecting through the printed circuit board to secure the component 94 to the latter. The operation of the clincher assembly 36 is automatic and is coordinated with that of the component insertion head 30.

Thereafter, the hydraulic cylinder 44 is activated to retract the slide insert 56 which action, in turn, retracts the detent carrier slide 57 and the cam and detent carrier slide 60. As these latter slides retract and the detents 64 and 72 seat within the detent seats 65 and 73 in the lead cutter slide 58 and the lead form slide 61, the latter likewise are retracted. The cam 75 upon engaging the end of the lead form lever arm 77 pivotally operates it to reposition its opposite end for the subsequent operation. The index slide actuating pin 68 (FIG. 5) affixed to the detent carrier slide 57 engages the arm 71 of the index lever 69 to pivotally operate the latter to engage its other arm 93 with the pin 92. In doing so, the index pawl actuator slide 85 is slidably moved downwardly and this action, in turn, engages the index pawl 83 with the index wheel 80 to rotatably index the latter to feed and to position the next component to be inserted.

From the above description, it can be seen that the component insertion system not only is of an improved construction but, furthermore, provides an improved method for affixing components to printed circuit boards. More particularly, with the disclosed system, a method is disclosed which includes the steps of transporting printed circuit boards in an inline manner to each of a number of stations generally defined by an X-Y table having a component insertion head and an associated clincher assembly mounted thereon, positionally aligning the printed circuit boards at these stations, operating the X-Y tables to positionally align the component insertion heads and their associated clincher assemblies at a pre-established X and Y coordinate position with respect to the printed circuit boards, angularly rotating the component insertion heads and their associated clincher assemblies to a pre-established angular orientation with respect to the printed circuit boards, and then operating with component insertion heads and their associated clincher assemblies to affix a component to the printed circuit boards. Thereafter, the component insertion heads and the clinchers can be again positionally adjusted to affix another component to the printed circuit board, or alternatively, the printed circuit boards can be indexed to positionally align them at another station whereat another component is affixed thereto. The programming can be such that all or only a predetermined one or more of the stations is operable at any one time. In other words, at one station, for example, a number of components can be affixed to a printed circuit board while at one or more other stations, only a single or no component can be affixed to a printed circuit board, the operation being solely dependent upon the computer programming controlling each of the individual stations. Furthermore, it is apparent that the component insertion heads and their associated clincher assemblies can be fixed against rotation, in which case only the X-Y tables are operated to position the heads and the clincher assemblies at a pre-determined X-Y coordinate position. By angularly, fixedly positioning the component insertion heads and the clincher assemblies, the components can be affixed to the printed circuit boards in any pre-established orientation with respect to them. The component insertion heads and the clincher assemblies also can be fixedly positioned as in an ordinary inline system and simply made so that they can be angularly oriented. It will be appreciated, however, that with such a construction, many of the described advantages will be forfeited.

The computer programming for operating the X-Y tables, the component insertion heads, the clincher assemblies, the inline conveyor, as well as the magazine feeder and the remaining apparatus of the component insertion system, can be designed and include various different electrical and electronic controls presently on the market. Accordingly, the specific computer programming and controls disclosed do not represent only those which an be used, for the design thereof can be established in accordance with the specific demands and needs in a particular installation. Also, while its specific arrangement is described for controlling the positioning, particularly the angular rotation of the component insertion heads and the clincher assemblies, it will be appreciated that other arrangements such as a servo system, a step-by-step system and the like can as well be used.

It will thus be seen that the objects set forth above, among those made apparent from the preceding description, are efficiently attained and certain changes may be made in carrying out the above method and in the construction set forth. Accordingly, it is intended that all matter contained in the above description or shown in the accompanying drawings shall be interpreted as illustrative and not in a limiting sense.

Now that the invention has been described, what is claimed as new and desired to be secured by Letters Patent is:

1. A component insertion system for automatically affixing components onto printed circuit boards comprising in combination: an inline conveyor for transporting a plurality of said printed circuit boards through said system; at least one station positioned adjacent said conveyor and comprising an X-Y table having a component insertion head and a clincher assembly mounted thereon for affixing components onto said printed circuit boards as they are transported on said conveyor to said station, means for operating said X-Y table to position said component insertion head and said clincher assembly in a pre-determined X-Y coordinate position with respect to said printed circuit board transported to said station on said conveyor, whereby a component can be affixed onto said printed circuit board in any pre-determined X-Y coordinate position.

2. The component insertion system of claim 1, wherein said component insertion head and said clincher assembly are rotatably mounted on said X-Y table and are operated to position them in a pre-determined angular orientation with respect to said printed circuit boards, whereby a component can be affixed onto said printed circuit boards in any X-Y coordinate position at any angular orientation.

3. The component insertion system of claim 2, including a plurality of said stations positioned in spaced relationship along the length of said inline conveyor, said conveyor being operated to transport said plurality of printed circuit boards along the length thereof and to positionally align individual ones of said printed circuit boards at said stations, said component insertion heads and the clincher assemblies associated therewith being operated to affix components onto said printed circuit positionally aligned with the respective stations.

4. The component insertion system of claim 3, further including a magazine feeder for storing a plurality of printed circuit boards and for feeding them individually onto said inline conveyor.

5. In a component insertion system of the type including at least one station whereat components are affixed onto printed circuit boards and means for feeding and positioning printed circuit boards at said station, an improved station comprising an X-Y table, a component insertion head and a clincher assembly, said component insertion head and said clincher assembly being mounted on said X-Y table in a cooperative relationship to affix a component onto a printed circuit board, said X-Y table being operated to position said component insertion head and said clincher assembly in a predetermined X-Y coordinate position with respect to said printed circuit board, whereby a component can be affixed onto said printed circuit board in any predetermined X-Y coordinate position.

6. In the component insertion system of claim 5, said component insertion head and said clincher assembly being rotatably mounted on said X-Y table and operated to position them in a pre-determined angular orientation with respect to said printed circuit board.

7. A method of affixing components onto printed circuit boards in a component insertion system including at least one station comprising an X-Y table, a component insertion head, a clincher assembly operatively associated with said component insertion head, and conveyor means for feeding and positioning printed circuit boards at said station, said method including the steps of mounting said component insertion head and said clincher assembly to said X-Y table, transporting and aligning a printed circuit board at said station, operating said X-Y table to positionally align said component insertion head and its associated clincher assembly at a pre-established X and Y coordinate position with respect to said printed circuit board, and then operating said component insertion head and said clincher assembly to affix a component onto said printed circuit board.

8. The method of claim 7, further including the steps of rotatably mounting said component insertion head and said clincher assembly to said X-Y table, and subsequent to or simultaneously with operating said X-Y table rotating said component insertion head and said clincher assembly to a predetermined angular orientation with respect to said printed circuit board.

9. The method of claim 7, further including the steps of providing an inline conveyor and a plurality of said stations positioned in spaced relationship along the length of said inline conveyor, transporting a plurality of said printed circuit boards on said conveyor and positionally aligning one of said printed circuit boards at each of said stations, and simultaneously operating predetermined ones of said X-Y tables and the component insertion head and clincher assembly mounted thereon to affix components to the respective ones of said printed circuit boards.

10. A component insertion system for automatically affixing components to printed circuit boards comprising an inline conveyor for transporting printed circuit boards along the length thereof, a plurality of stations disposed in spaced relationship along the length of said inline conveyor, each of said stations including an X-Y table having a component insertion head and a clincher assembly operatively associated therewith to affix components onto printed circuit boards mounted thereon, means for operating said conveyor to transport and position said printed circuit boards at each of said stations, means for operating said X-Y tables to position said component insertion heads and clincher assemblies mounted thereon in pre-determined X and Y coordinate positions with respect to said printed circuit boards at the respective ones of said stations, and means for operating said component insertion heads and said clincher assemblies to affix components onto said printed circuit boards.

11. The component insertion system of claim 10, further including means for rotatably mounting said component insertion heads and said clincher assemblies on said X-Y tables, and means for rotatably operating said component insertion heads and said clincher assemblies to pre-determined angular orientations with respect to said printed circuit boards.

12. In a component insertion system for automatically affixing components having oppositely extending wire leads thereon onto apertured printed circuit boards, a component insertion head comprising: a lead cutter slide for cutting said wire leads; a lead forming slide for forming said wire leads; a slide insert for inserting said wire leads into and through said apertures in said printed circuit board; a detent carrier slide affixed to and movable with said slide insert and having detent means engageable with said lead cutter slide for operating said lead cutter slide to cut said wire leads; a cam and detent carrier slide affixed to and movable with said slide insert and having detent means engageable with said lead forming slide for operating said lead forming slide to form said wire leads; all of said slides being slidably disposed and retained within a body member; means for slidably moving said slide insert in a reciprocating manner within said body member; all of said slides being operatively moved simultaneously upon movement of said slide insert and the operation of said detent means being such that said lead cutter slide first is moved to engage and to cut said wire leads, said lead forming slide then is engaged with said cut wire leads to form them and said slide insert then is engaged with said cut and formed wire leads to extend them through said apertures in said printed circuit board.

13. In a component insertion system, the component insertion head of claim 12, wherein said first detent means is disengaged from said lead cutter slide upon the latter cutting said wire leads to thereby terminate further movement of said lead cutter slide.

14. In a component insertion system, the component insertion head of claim 13 wherein said lead forming slide further is formed to frictionally support and to move said component after forming said wire leads, and said second detent means is disengaged from said lead forming slide to thereby terminate further movement of said lead cutter slide when said component being frictionally supported and moved by it is positioned substantially immediately adjacent said printed circuit board.

15. In a component insertion system, the component insertion head of claim 12 further including a lead forming lever are pivotally supported on said body member with its one end disposed to cooperate with said lead forming slide to form said wire leads, a cam surface on said cam and detent carrier slide normally engaged by the opposite end of said lead forming lever arm to retain said one end in cooperative lead forming relationship with said lead forming slide, said lead forming lever arm being pivotally operated to move said one end out of said cooperative lead forming relationship after said wire leads are formed.

16. In a component insertion system, the component insertion head of claim 15 further including means for determining the angular rotated position of said component insertion head and for controlling the operation of said means for operating said drive means to position said component insertion head in a pre-established angularly rotated position.

17. In a component insertion system, a component insertion head as claimed in claim 12 further including a support arm, means affixed to said support arm for rotatably supporting said component insertion head in a vertically disposed position, gear means secured to said component insertion head, a hydraulic rotary actuator supported by said support arm and coupled to said gear means for rotating said component insertion head, and means for operating said rotary actuator.

18. In a component insertion system, the component insertion head of claim 12 further including a pair of spaced apart index wheels supported by said body member for indexing components fed thereto in working relationship with said slides, an index pawl actuator slide slidably supported within said body member having an index pawl pivotally affixed thereto and engaged with one of said index wheels to operate the latter upon operation of said index pawl actuator slide, an index slide actuating pin affixed to said detent carrier slide, an actuating pin affixed to said index pawl actuator slide; an indexing lever pivotally affixed to said body member and having one arm positioned to be engaged by said index slide actuating pin so as to pivotally operate said indexing lever to each its other arm with said actuating pin to operate said index pawl actuator slide to thereby cause said index pawl to operate said index wheel to index a component into working relationship with said slides when said slide insert is operated to a retracted position after inserting a component into said apertured printed circuit board.

19. In a component insertion system, the component insertion head of claim 12 further including a support arm, means affixed to said support arm for rotatably supporting said component insertion head in a vertically disposed position, drive means affixed to said support arm and coupled to component insertion head for rotating said component insertion head, and means for operating said drive means.

20. In a component insertion system for automatically affixing jumper wires onto apertured printed circuit boards, a jumper wire insertion head comprising: a lead cutter slide for cutting said jumper wires; a lead forming slide for forming said jumper wires; a slide insert for inserting said jumper wires into and through said apertures in said printed circuit board; a detent carrier slide affixed to and movable with said slide insert and having detent means engageable with said lead cutter slide for operating said lead cutter slide to cut said jumper wires; a cam and detent carrier slide affixed to and movable with said slide insert and having detent means engageable with said lead forming slide for operating said lead forming slide to form said jumper wires; all of said slides being slidably disposed and retained within a body member; means for slidably moving said slide insert in a reciprocating manner within said body member; all of said slides being operatively moved simultaneously upon movement of said slide insert and the operation of said detent means being such that said lead cutter slide first is moved to engage and to cut said jumper wires, said lead forming slide then is engaged with said cut jumper wires to form them and said slide insert then is engaged with said cut and formed jumper wires to extend them through said apertures in said printed circuit board.

21. In a component insertion system, the jumper wire insertion head of claim 20, further including means for feeding a pre-determined length of wire from a substantially continuous supply of wire to said head, means for securing said pre-determined length of wire in a fixed position, and means for guiding said pre-determined length of wire beneath said slides in a position such that said slides upon being operated cut, form and insert said jumper wire into said printed circuit board.

22. In a component insertion system, the jumper wire insertion head of claim 21, wherein said means for feeding a pre-determined length of wire comprises a hydraulic cylinder having a piston, gripping means on the end of said piston operable to grip said wire to advance said wire on the downward stroke of said piston and to release said wire on the return upward stroke of the piston, said cylinder and said piston being formed to receive said wire therethrough in a fashion such as to be received by said gripping means.

23. In a component insertion system, the jumper wire insertion head of claim 22, wherein said means for securing said pre-determined length of wire comprises a wire stop and gripper means operable to feed wire therethrough on the downward stroke of said piston and to grip said wire on the return upward stroke of said piston, whereby the length of wire fed to said jumper wire insertion head by said piston is fixedly held by said wire stop and gripper means.

24. In a component insertion system, the jumper wire insertion head of claim 23, wherein said means for guiding said pre-determined length of wire comprises a hollow tubular member.

* * * * *